United States Patent [19]

Pinkhasov

[11] Patent Number: 4,869,203

[45] Date of Patent: Sep. 26, 1989

[54] APPARATUS FOR COATING A METAL GAS-PRESSURE BOTTLE OR TANK

[75] Inventor: Eduard Pinkhasov, Eastchester, N.Y.

[73] Assignee: Vapor Technologies Inc., Mt. Vernon, N.Y.

[21] Appl. No.: 317,938

[22] Filed: Mar. 2, 1989

Related U.S. Application Data

[62] Division of Ser. No. 220,591, Jul. 18, 1988.

[51] Int. Cl.4 .......................... B05B 5/00; B05C 5/00
[52] U.S. Cl. ..................................... 118/723; 427/37;
118/50.1; 118/620; 204/298; 204/192.38;
219/121.52; 428/35.8
[58] Field of Search .................. 427/37, 250; 118/620, 118/50.1, 723; 428/35.8, 627; 219/121 PR; 204/298, 192.38

[56] References Cited

U.S. PATENT DOCUMENTS 4,609,564 9/1986 Pinkhasov .......................... 427/37

Primary Examiner—Shrive Beck
Assistant Examiner—Roy V. King
Attorney, Agent, or Firm—Herbert Dubno

[57] ABSTRACT

An electric arc vapor deposition apparatus for coating the internal surface of a metal gas-pressure tank has a sealing plug, a means on the plug coupled with a vacuum pump for evacuating the tank, a material-supplying electrode mounted on the plug and an electrical source connectable between the tank and the electrode to supply electric arc energy.

3 Claims, 1 Drawing Sheet

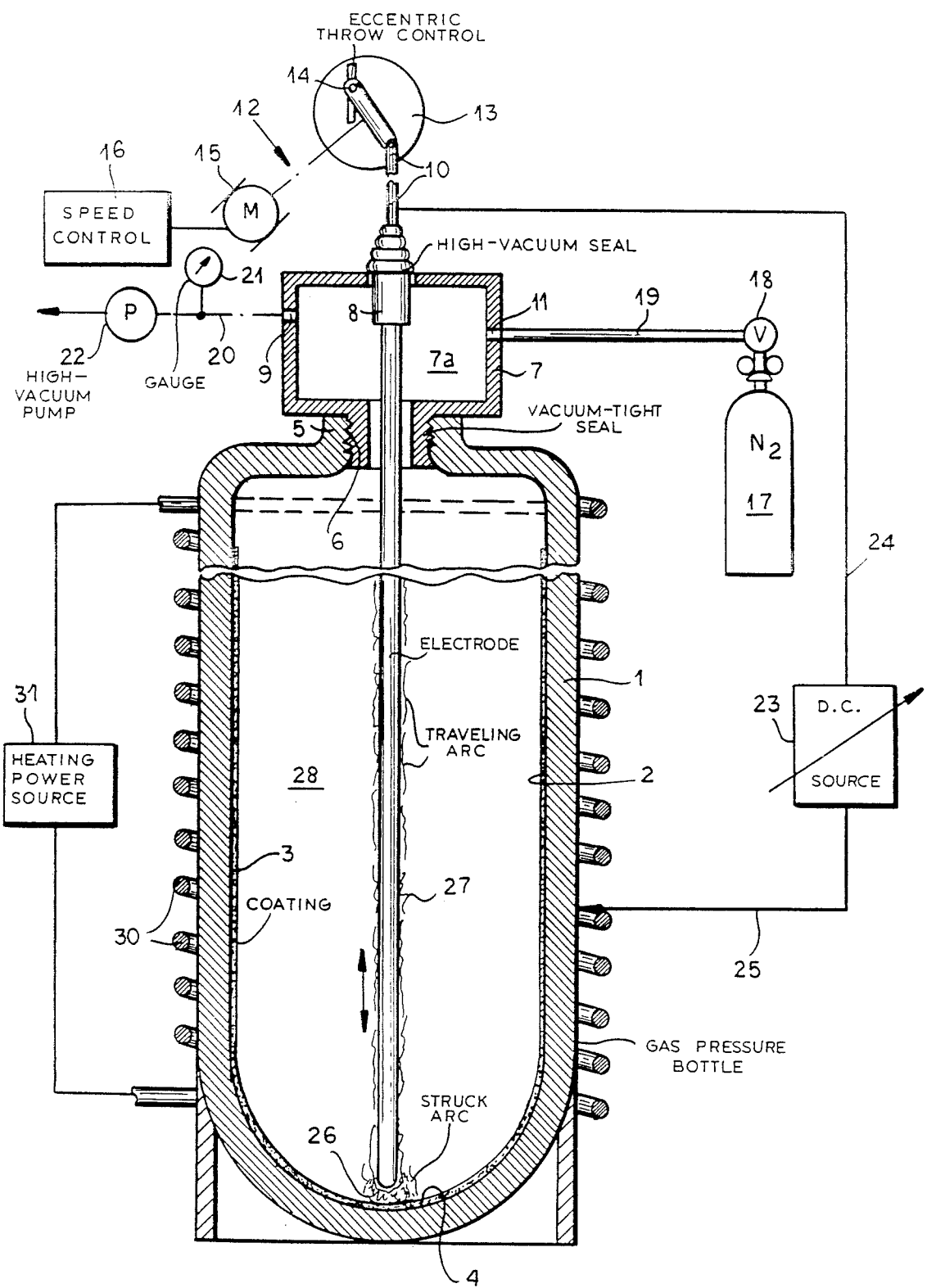

APPARATUS FOR COATING A METAL GAS-PRESSURE BOTTLE OR TANK

This is a division of co-pending application Ser. No. 220,591, filed on July 18, 1988.

CROSS REFERENCE TO RELATED APPLICATION

This application is related to my copending application Ser. No. 06/941,185 filed Dec. 12, 1986, now U.S. Pat. No. 4,828,934 and also relates to subject matter disclosed in prior applications linked to this copending application and which have matured into U.S. patents:

| | | |
|---|---|---|
| 4,351,855, | 4,438,153, | 4,505,948, |
| 4,537,794, | 4,548,670, | 4,565,711, |
| 4,569,307, and | 4,575,401. | |

FIELD OF THE INVENTION

My present invention relates to a method for the internal coating of metal pressure vessels, namely, pressurized-gas bottles and tanks and particularly pressurized-gas cylinders or tanks which are required to maintain a high purity of the gas contents. The invention also relates to an apparatus for performing the method and to the coated cylinders or tanks which are the products of the method.

BACKGROUND OF THE INVENTION

It is known that gases under pressure are stored and marketed in elongated metal gas-pressure tanks, usually composed of steel having a closed bottom and a mouth to which a pressure reducer or other valve arrangement may be affixed for the dispensing of the gas.

In many cases, the stored gas is required to be maintained at high purity. This is particularly the case for gases which are used in scintillation, chromatographic and other analytical processes, for gases which are utilized to maintain a predetermined atmosphere for analytical and reaction purposes, and for gases which are to constitute standards, e.g. for analytical purposes, as well as for gases which are required in a high purity state for reactions involving the gases themselves.

When such gases are exposed to the steel surfaces forming the inner wall of such a tank, however, there is the possibility of contamination of the gases by the materials of which the wall may be constituted, thereby reducing the purity of the gas or rendering it unfit for particular purposes.

It has been proposed, therefore, to line interiors of such tanks with substances which themselves do not contaminate the gas and which serve as a barrier to contamination of the gas by materials from the underlying wall structure.

However, the very nature of the tanks, namely, their long dimensions, the narrow mouth providing the only access and the closed bottom, create coating problems for conventional coating techniques. Furthermore, many conventional coating techniques which might be useful for applying, for example, synthetic resin coatings, cannot be used effectively to apply highly adherent relatively thin coatings of more esoteric materials, for example, the nitrides, borides and carbides of refractory metals such as tungsten, titanium, tantalum and zirconium.

In the above-mentioned application and patents, there is disclosed a method and apparatus for applying metals and their compounds to a variety of substrates utilizing the repeated striking of an arc to generate vapor from at least one of the electrodes so that the vapor, with or without reaction with other materials, is caused to deposit upon a substrate which is provided together with the arc-striking system in an evacuated vessel or chamber.

For this system, large-area coating and the internal coating of pipes could make use of the fact that, after being struck and before being quenched by the next contact between the electrodes, the arc may travel for some distance along the electrode to permit evaporation over a substantial length of the electrode.

However, that approach as described in the aforementioned patent and application is not directly applicable to the internal coating of gas-pressure bottles and tanks of the type described because the introduction of the gas-pressure tank into an evacuated vessel is not practical.

OBJECTS OF THE INVENTION

It is, therefore, the principal object of the present invention to provide an improved method of internally coating a gas-pressure bottle or tank, particularly for the high purity storage, transport and marketing of gases whereby the drawbacks of earlier attempts to internally coat such bottles can be avoided.

Another object of this invention is to provide an improved apparatus which will enable the coating of such gas-pressure tanks or bottles.

It is also an object of the invention to provide an improved pressure tank for high purity gases.

SUMMARY OF THE INVENTION

These objects and others which will become apparent hereinafter can be attained, utilizing some of the principles set forth in the above-mentioned application and patents, when the mouth of the tank is plugged so that the tank itself becomes the pressure vessel which is evacuated and a wall of the metal tank forms a counter-electrode for the repetitive arc-striking which causes evaporation of the material from the sacrificial electrode which contributes the coating material or a part thereof.

Thus the method of the invention comprises the steps of:

(a) plugging the mouth with a sealing closure to define a closed chamber within the tank;

(b) evacuating the chamber through the closure to a vacuum capable of sustaining an electric arc;

(c) repeatedly striking electric arcs between a wall of the tank and an electrode in the chamber by connecting an electric power source across the tank and the electrode and repeatedly approaching the electrode into contact with and withdrawing the electrode from contact with the wall of the tank, thereby generating a succession of the arcs; and (d) controlling the vacuum drawn in the chamber, the electrical power supplied by the source and the repetition rate of the striking of the arcs so that the arcs upon being struck migrate along the electrode and evaporate material from the electrode to effect coating of the interior of the tank substantially over the height thereof at least in part with the material evaporated from the electrode.

The vacuum drawn through the plug in the chamber should decrease the pressure therein to at most $10^{-5}$ torr and across the electrode and the tank a direct-current electric source can apply a voltage of 30 to 150 volts and can be capable of delivering a current of 40 to 150 amperes to generate the arc. The repetition rate of arc striking is preferably 10 to 120 per minute and the electrode is most advantageously composed of silicon, tungsten, titanium, tantalum, zirconium or an alloy or compound thereof. The coating is deposited to a thickness preferably of 1 to 5 microns, it being understood that while continuity of the coating and uniform coverage of the internal surface of the tank is important, the coating should be as thin as possible to minimize the possibility of ablation of the coating as the thermal conditions to which the tank may be subject can vary.

The coating itself may be a boride, nitride, carbide or silicide of one or more of the electrode materials if nitrogen, silicon, boron or carbon is admitted to the chamber in a gaseous form or is otherwise made available in the chamber, e.g. in a sacrificial solid which may be fed into the region of the arc.

The invention also involves an apparatus specifically designed for the coating of these vessels, which apparatus comprises:

a plug sealingly and removably threadedly engageable with the mouth to close a chamber formed within the tank so as to enable the chamber to be evacuated to a vacuum of a pressure of at most $10^{-5}$ torr;

means on the plug communicating with the chamber and coupled with a vacuum pump for evacuating the chamber;

an electrode mounted on the plug and reciprocatingly displaceable into and out of contact with a wall of the tank in the chamber repetitively to strike electric arcs between the electrode and the wall; and an electrical source connectable between the tank and the electrode to supply electrical energy for the arcs, whereby the arcs after being struck travel along the electrode and evaporate material therefrom to coat the interior of the tank at least in part with the material.

The plug may here also include means for feeding a gas, e.g. nitrogen, into the chamber for reaction with the electrode material.

BRIEF DESCRIPTION OF THE DRAWING

The above and other objects, features and advantages of the present invention will become more readily apparent from the following description, reference being made to the accompanying drawing, the sole FIGURE of which is a diagrammatic cross section showing the internal coating of a gas-pressure tank in accordance with the invention.

DESCRIPTION

In the drawing, I have shown a stylized gas-pressure tank or cylinder 1 which, as may be understood, can be of conventional design and of a height, say, of 1 to 2 m, can have a closed bottom and a narrow neck 5 provided with an internal thread 6 surrounding a mouth which is the sole means for access to the steel gas-pressure bottle.

The gas-pressure bottle is internally coated in accordance with the invention, by threading removably a plug 7 into the mouth of the bottle, the plug 7 forming a housing and carrying through a high-vacuum seal 8 an electrode 10 which extends over the height of the cylinder and has its free end juxtaposed with the bottom wall 4 within chamber 28 of the tank.

The coating has been exaggerated in thickness at 3 in the drawing and bonds adheringly to the inner surface 2 of the bottle over the entire height thereof. A resistance or inductive heating coil 30 energized by an electrical power source 31 surrounds the bottle.

The electrode 10 is reciprocated vertically, alternately into contact with the bottom wall 4 and out of contact therewith, each contact quenching the previous arcs and generating a new group of arcs as represented at 26. These arcs tend to travel along the electrode as represented at 27 so that the evaporation of electrode material occurs over the full length of the electrode to ensure a substantially uniform deposition of the coating 3 over the entire height of the bottle.

The plug 7 is provided with a fitting 9 permitting a suction pump 22 to be coupled by a pipeline 20 with the interior of the tank through the housing chamber 7a so that it can be evacuated to reduce the pressure therein to $10^{-5}$ torr or a higher vacuum. A vacuum gauge 21 may be provided so that the development of the vacuum can be followed.

Reciprocation of the electrode 10 into and out of contact with the end wall 4 of the bottle can be effected by an eccentric arrangement represented at 13 and the throw of which can be controlled at 14 so that the stroke of the electrode per reciprocation can be adjusted. The eccentric 13 is driven by a motor 15 having a speed control 16 so that the mechanism 12 for reciprocating the electrode can have an adjustable arc-striking repetition rate.

The plug 7 is also provided with a fitting 11 which can connect a pressure bottle 17 containing nitrogen, for example, through the valve 18 to the chamber 28 when, for example, the formation of a nitride as the coating is desired.

The electrical source connected across the electrode 10 and the tank 1 is a direct-current source 23 connected by conductors 24 and 25 in the arc-striking circuit and can apply a voltage of 30 to 150 volts across the tank and the electrode and can supply a current of 40 to 150 amperes.

EXAMPLE

A steel gas-pressure bottle of a height of approximately 1.5 m and a diameter of about 30 cm is internally coated utilizing an apparatus as generally described upon being evacuated to a pressure of Nitrogen around $10^{-3}$ to $10^{-4}$ torr, with a titanium voltage between 30 and 150 volts and current of about 60 amperes. The arc-striking repetition rate was about 45 per minute. Nitrogen is bled into the system to form a coating of titanium nitride to a thickness of 1 to 2 microns. To promote adhesion of the coating, using the electric heater 30, the bottle is heated to an elevated temperature, say 500° C., which is less than the recrystallization and transformation temperatures of the steel.

I claim:

1. An apparatus for the internal coating of a pressure tank adapted to contain a high-purity gas at an elevated pressure and wherein said tank is composed of metal, is closed at a lower end and has a narrow mouth at an upper end formed with a screwthread, said apparatus comprising:

a plug sealingly and removably threadedly engageable with said mouth to close a chamber formed within said tank so as to enable said chamber to be evacuated to a vacuum of a pressure of at most $10^{-5}$ torr;

means on said plug communicating with said chamber and coupled with a vacuum pump for evacuating said chamber;

an electrode mounted on said plug and reciprocatingly displaceable into and out of contact with a wall of said tank in said chamber repetitively to strike electric arcs between said electrode and said wall; and an electrical source connectable between said tank and said electrode to supply electrical energy for said arcs, whereby said arcs after being struck travel along said electrode and evaporate material therefrom to coat the interior of said tank at least in part with said material.

2. The apparatus defined in claim 1, further comprising means in said plug communicating with the chamber for admitting a gas thereto, said gas supplying an element reactive with said material evaporated from said electrode to form said coating.

3. The apparatus defined in claim 1, further comprising means for heating said tank during the coating of the interior thereof.

* * * * *